Oct. 12, 1965 R. P. DONOVAN ETAL 3,212,020

MONOLITHIC SEMICONDUCTOR BANDPASS AMPLIFIER

Filed Aug. 4, 1961

WITNESSES

Edwin E. Bassler

James F. Young

INVENTORS

Robert P. Donovan, Irving F. Barditch and Walter H. Kuckes

BY Maury I. Hull

ATTORNEY

United States Patent Office 3,212,020
Patented Oct. 12, 1965

3,212,020
MONOLITHIC SEMICONDUCTOR BANDPASS AMPLIFIER

Robert P. Donovan, Severna Park, and Irving F. Barditch, Baltimore, Md., and Walter H. Kuckes, Boulder, Colo., assignors to Westinghouse Electric Corporation, East Pittsburgh, Pa., a corporation of Pennsylvania
Filed Aug. 4, 1961, Ser. No. 129,416
3 Claims. (Cl. 330—38)

This invention relates to improvements in bandpass amplifiers, and more particularly to an improved semiconductor bandpass amplifier suitable for monolithic construction.

In summary, the bandpass amplifier of the instant invention utilizes the frequency response of a semiconductor high-pass filter formed by a reverse biased p-n junction, in series with a junction transistor. When the signal to be amplified is of low frequency the signal is essentially blocked, but as the frequency is increased more and more of the signal reaches the base region of the transistor where it is amplified. At still higher frequencies the frequency response of the transistor causes less and less gain until finally no gain occurs at all, and thereby the effect of a bandpass amplifier is provided.

Accordingly, a primary object of the invention is to provide a new and improved bandpass amplifier.

Another object is to provide a new and improved semiconductor bandpass amplifier suitable for monolithic construction.

These and other objects will become more clearly apparent after a study of the following specification, when read in connection with the accompanying drawings, in which.

Figure 1:
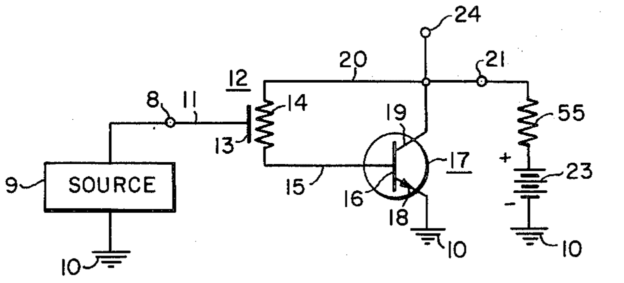
FIGURE 1 is a schematic electrical circuit diagram of apparatus embodying the invention.

Referring now to the drawings, in which like reference numerals are used throughout to designate like parts, for a more detailed understanding of the invention, and in particular to FIG. 1 thereof, there is shown at 9 a source of a signal to be amplified, developing the signal between ground 10 and terminal 8 and lead 11, which is connected to one region 13 of one type of semiconductivity of a p-n junction generally designated 12, having an additional region 14 of the other type of semiconductivity, with leads 15 and 20 connected by nonrectifying or ohmic contacts to opposite ends of the region 14. The source 9 preferably is of such a nature as to provide a direct current return path to ground from region 13, and source 9 is preferably resistive in nature. In the event that it is desired to employ a source 9 which does not provide a direct current return path, a resistor, not shown, may be connected in shunt with the source 9. In accordance with the choice of a transistor at 17, which is shown as an NPN transistor, terminal 21 is connected by way of load resistor 55 to the positive terminal of a source of direct current potential 23, having the other negative terminal connected to ground 10. Lead 20 is accordingly positive with respect to ground, and in order that junction 12 may be reverse-biased, region 14 must be of N type material and region 13 of P type material, providing the effect of distributed resistance and distributed capacitance in the junction 12, and in effect providing a high-pass filter. Aforementioned lead 15 is connected to the base 16 of the transistor generally designated 17, having emitter 18 connected to ground 10 and having collector 19 connected to the aforementioned lead 20 and output terminal 24.

Figure 3:
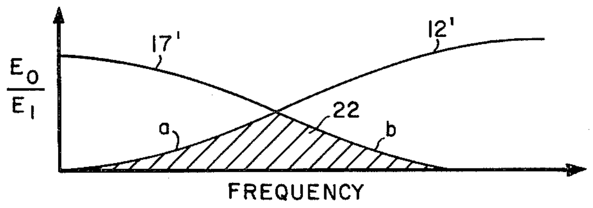
FIG. 3 is a graph illustrating the operation of the apparatus of FIGS. 1 and 2.

Particular reference is made now to FIG. 3. In FIG. 3 the curve 17′ illustrates the transistor frequency response characteristic, or gain, whereas the curve 12′ illustrates the frequency response characteristic of the high-pass filter 12. It will be seen that these two curves slope in opposite directions and that there is an area or amplified region designated 22 encompassed by the portion "*a*" of curve 12′ and the portion "*b*" of curve 17′.

Figure 2:
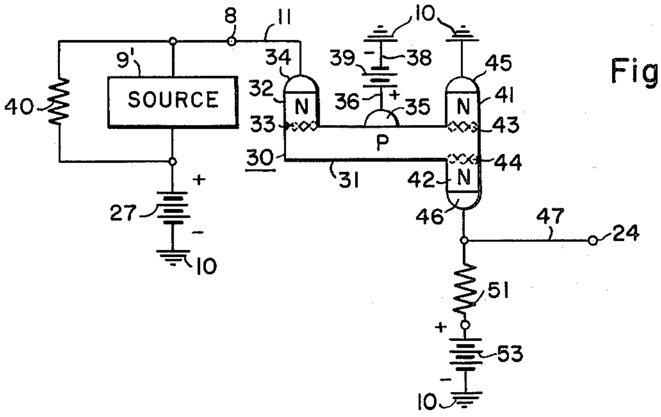
FIG. 2 illustrates the preferred embodiment of the invention wherein the apparatus is made in monolithic semiconductor form.

Particular reference is made now to FIG. 2, showing the invention in monolithic semiconductor form. A transistor device generally designated 30 has an elongated region of p-type semiconductivity 31 and on the left-hand end as seen in FIG. 2 has a region 32 of n-type semiconductivity forming the junction 33. An ohmic contact 34 for the n-type region 32 is connected by way of lead 11 to the input terminal 8, which is connected to source 9′. Source 9′ is assumed for purposes of explanation not to provide a direct current return path, so that resistor 40 having a suitable value is connected in shunt with source 9′. Connected in series circuit between source 9′ and ground is a direct current biasing source 27 having the positive terminal connected to signal source 9′. The aforementioned region 31 of p-type semiconductivity has ohmic contact 35 thereto which is connected by way of lead 36, a source of direct current potential 39 and lead 38 to ground 10. The source 39 has the positive terminal thereof connected to ohmic contact 35. Source 27 is of greater magnitude than source 39 so that a reverse bias is applied to the junction 33 formed between regions 31 and 32. Source 39 also serves to forward bias an emitter portion 41 of a transistor with respect to base region 31. At the other or right-hand extremity of the aforementioned p region 31 are two n regions 41 and 42 forming junctions 43 and 44 respectively, the n-type region 41 as aforementioned serving as a transistor emitter and having ohmic contact 45 thereto connected to ground 10, and the n-type semiconductivity region 42 having ohmic contact 46 thereto connected by way of lead 47 to an output terminal 24. Lead 47 has one end of load resistor 51 connected thereto, the other end of resistor 51 being connected to the positive terminal of a source of direct current potential 53 having the negative terminal thereof connected to ground 10.

In the monolithic structure of FIG. 2, the junction 33 between regions 32 and 31 corresponds to the aforementioned junction 12 of FIG. 1, the elongated p-type region 31 providing resistance, and the right-hand end of the p region 31 with the adjacent "n" regions 41 and 42 providing in effect an n-p-n transistor corresponding to the transistor 17 of FIG. 1. It will be apparent to those skilled in the molecular engineering art that the structure of FIG. 2 may be formed in a single block of semiconductor material by suitable placement of impurities of the correct types and concentrations, and in the desired places to provide the necessary effects.

A resistor may be inserted in lead 38 if desired.

In the claims appended hereto it should be understood that the terms "transistor," "resistor," "lead," and "capacitor" may refer to suitably doped regions of a single block of semiconductor material.

Resistor 51 may in some cases be dispensed with if desired, and an output load of a resistive nature connected in series with source 53. Other biasing arrangements of the input lead 11 are also contemplated.

Should the source 9′, FIG. 2, provide a direct current return path, resistor 40 may be eliminated.

Whereas the invention has been shown and described with respect to some embodiments thereof which give satisfactory results, it should be understood that changes may be made and equivalents substituted without departing from the spirit and scope of the invention.

We claim as our invention:

1. A bandpass signal system comprising a semiconductor device including a first region of one type of semiconductivity, a second region of the opposite type of semiconductivity, said regions being in juxtaposed relation to form a p-n junction distributed RC network having a high pass frequency response characteristic, input means for applying input signals to said first region of said p-n junction, transistor amplifier means including base, collector and emitter regions, said amplifier means having a low pass frequency characteristic, said second region being continuous from said p-n junction to and including said base region without any change in semiconductivity type and with a portion of said region constituting said base, said base constituting the input to said amplifier means and being coupled to said input means through said distributed RC network and means for reverse biasing said p-n junction.

2. A bandpass signal system comprising a semiconductor device including a first region of one type of semiconductivity, a second region of the opposite type of semiconductivity, said regions being in juxtaposed relation to form a p-n junction distributed RC network having a high pass frequency response characteristic, input means for applying input signals to said first region of said p-n junction, transistor amplifier means including base, collector and emitter regions, said amplifier means having a low pass frequency characteristic, said second region being continuous from said p-n junction to and including said base region without any change in semiconductivity type and with a portion of said second region constituting said base, said base constituting the input to said amplifier means and being coupled to said input means through said distributed RC network, said collector being connected to said second region at a point spaced from said base region and circuit means including biasing means for reverse biasing said p-n junction.

3. A monolithic block constituting a bandpass signal translation system comprising a first region of one type of semiconductivity, a second region of the opposite type of semiconductivity associated in continguous juxtaposed relation with said first region to form a first rectifying p-n junction, third and fourth regions of the same type of semiconductivity as said first region, each operatively associated in continguous relation with said second region in rectifying p-n junctions to form collector and emitter regions, respectively, thereby constituting a transistor device with a portion of said second region serving as the base, said collector being connected to a point on said second region spaced from said base portion, direct current circuit means connecting said first region to a common circuit point, a source of direct current potential connected between said collector and said common circuit point, whereby a D.C. voltage applied to reverse bias the collector-base junction also reverse biases said first p-n junction.

References Cited by the Examiner

UNITED STATES PATENTS

| | | | |
|---|---|---|---|
| 2,816,228 | 12/57 | Johnson | 307—88.5 |
| 3,115,581 | 12/63 | Kilby | 330—38 |
| 3,118,114 | 1/64 | Barditch | 330—31 XR |
| 3,148,344 | 9/64 | Kaufman | 307—88.5 |

OTHER REFERENCES

Hager: Electronics, vol. 32, No. 36, pp. 44–49, Sept. 4, 1959, Network Design of Microcircuits (FIG. 15).

Kaufman: IRE Proceedings, September, Theory of a Monolithic Null Device and Some Novel Circuits, pp. 1540–1543, pp. 1540–141.

ROY LAKE, *Primary Examiner.*

JOHN KOMINSKI, NATHAN KAUFMAN, *Examiners.*